US008649170B2

(12) United States Patent
Dunn et al.

(10) Patent No.: US 8,649,170 B2
(45) Date of Patent: Feb. 11, 2014

(54) SYSTEM AND METHOD FOR SELECTIVELY ENGAGING COOLING FANS WITHIN AN ELECTRONIC DISPLAY

(71) Applicant: Manufacturing Resources International, Inc., Alpharetta, GA (US)

(72) Inventors: William Dunn, Alpharetta, GA (US); Tim Hubbard, Alpharetta, GA (US); Ware Bedell, Alpharetta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 0 days.

(21) Appl. No.: 13/759,744

(22) Filed: Feb. 5, 2013

(65) Prior Publication Data

US 2013/0170139 A1 Jul. 4, 2013

Related U.S. Application Data

(63) Continuation of application No. 13/179,996, filed on Jul. 11, 2011, now Pat. No. 8,369,083, and a continuation-in-part of application No. 12/706,652, filed on Feb. 16, 2010, now Pat. No. 8,358,397, and a continuation-in-part of application No. 12/905,704, filed on Oct. 15, 2010, and a continuation-in-part of application No. 12/952,745, filed on Nov. 23, 2010, and a continuation-in-part of application No. 13/100,580, filed on May 4, 2011, and a continuation-in-part of application No. 13/100,556, filed on May 4, 2011.

(60) Provisional application No. 61/362,854, filed on Jul. 9, 2010.

(51) Int. Cl.
*G06F 1/16* (2006.01)
*H05K 5/00* (2006.01)

(52) U.S. Cl.
USPC .................. 361/679.47; 362/547; 349/161

(58) Field of Classification Search
USPC .................. 349/161; 361/679.47; 362/547
See application file for complete search history.

(56) References Cited

U.S. PATENT DOCUMENTS 4,093,355 A 6/1978 Kaplit et al.
4,593,978 A 6/1986 Mourey et al.
(Continued)

FOREIGN PATENT DOCUMENTS

JP 03153212 7/1991
JP 11160727 6/1999
(Continued)

OTHER PUBLICATIONS

Zeef, Hubing, EMC analysis of 18' LCD Monitor, Aug. 2000, 1 page.

*Primary Examiner* — Phu Vu
(74) *Attorney, Agent, or Firm* — Standley Law Group LLP

(57) ABSTRACT

A system and method for cooling an electronic image assembly having a plurality of cooling gas pathways place behind the electronic image assembly. A first fan may be used to force cooling gas through a first grouping of cooling gas pathways while a second fan may be used to force cooling gas through a second grouping of cooling gas pathways. Temperature sensing devices may be positioned so as to measure the temperature of the first and second groupings of cooling gas pathways. The speeds of the first and second fans may be adjusted based on the temperature measurements of the cooling gas pathway groupings. Additional fans with additional temperature sensing devices may be used for further accuracy and control over the temperature gradients of the electronic image assembly. Manifolds may be used to distribute/collect cooling gas to/from the cooling gas pathways.

20 Claims, 11 Drawing Sheets

(56) References Cited

U.S. PATENT DOCUMENTS

| | | |
|---|---|---|
| 4,634,225 A | 1/1987 | Haim et al. |
| 5,029,982 A | 7/1991 | Nash |
| 5,088,806 A | 2/1992 | McCartney et al. |
| 5,247,374 A | 9/1993 | Terada |
| 5,559,614 A | 9/1996 | Urbish et al. |
| 5,748,269 A | 5/1998 | Harris et al. |
| 5,767,489 A | 6/1998 | Ferrier |
| 5,818,010 A | 10/1998 | McCann |
| 5,869,919 A | 2/1999 | Sato |
| 6,089,751 A | 7/2000 | Conover et al. |
| 6,157,432 A | 12/2000 | Helbing |
| 6,191,839 B1 | 2/2001 | Briley |
| 6,417,900 B1 | 7/2002 | Shin et al. |
| 6,535,266 B1 | 3/2003 | Nemeth et al. |
| 6,628,355 B1 | 9/2003 | Takahara |
| 6,839,104 B2 | 1/2005 | Taniguchi et al. |
| 6,885,412 B2 | 4/2005 | Ohnishi et al. |
| 6,943,768 B2 | 9/2005 | Cavanaugh et al. |
| 7,059,757 B2 | 6/2006 | Shimizu |
| 7,083,285 B2 | 8/2006 | Hsu |
| 7,330,002 B2 | 2/2008 | Joung, II |
| 7,474,294 B2 | 1/2009 | Leo et al. |
| 7,795,821 B2 | 9/2010 | Jun |
| 2002/0101553 A1 | 8/2002 | Enomoto et al. |
| 2002/0126248 A1 | 9/2002 | Yoshida |
| 2003/0007109 A1 | 1/2003 | Park |
| 2003/0230991 A1 | 12/2003 | Muthu et al. |
| 2004/0036834 A1 | 2/2004 | Ohnishi et al. |
| 2004/0165139 A1 | 8/2004 | Anderson et al. |
| 2005/0213950 A1 | 9/2005 | Yoshimura |
| 2006/0022616 A1 | 2/2006 | Furukawa et al. |
| 2006/0132699 A1 | 6/2006 | Cho et al. |
| 2006/0199514 A1 | 9/2006 | Kimura |
| 2006/0209266 A1 | 9/2006 | Utsunomiya |
| 2007/0019419 A1 | 1/2007 | Hafuka |
| 2007/0140671 A1 | 6/2007 | Yoshimura |
| 2007/0151664 A1 | 7/2007 | Shin |
| 2007/0297163 A1 | 12/2007 | Kim et al. |
| 2009/0033612 A1 | 2/2009 | Roberts et al. |
| 2009/0104989 A1 | 4/2009 | Williams et al. |

FOREIGN PATENT DOCUMENTS

| | | |
|---|---|---|
| JP | 2006145890 | 6/2006 |
| JP | 2008034841 | 2/2008 |
| JP | 2008292743 | 12/2008 |
| KR | 20060016469 | 2/2006 |
| KR | 100666961 | 1/2007 |
| KR | 1020080000144 | 1/2008 |
| KR | 1020080013592 | 2/2008 |
| KR | 1020080086245 | 9/2008 |

SYSTEM AND METHOD FOR SELECTIVELY ENGAGING COOLING FANS WITHIN AN ELECTRONIC DISPLAY

CROSS-REFERENCE TO RELATED APPLICATIONS

This application is a continuation of U.S. application Ser. No. 13/179,996 filed on Jul. 11, 2011, now U.S. patent application Ser. No. 13/179,996, issued on Feb. 5, 2013. U.S. application Ser. No. 13/179,996 is a non-provisional application of U.S. Application No. 61/362,854 filed on Jul. 9, 2010. U.S. application Ser. No. 13/179,996 is also a continuation-in-part of U.S. application Ser. No. 12/706,652 filed on Feb. 16, 2010, now U.S. Pat. No. 8,358,397, issued Jan. 22, 2013. U.S. application Ser. No. 13/179,996 is also a continuation-in-part of U.S. application Ser. No. 12/905,704 filed on Oct. 15, 2010. U.S. application Ser. No. 13/179,996 is also a continuation-in-part of U.S. application Ser. No. 12/952,745 filed on Nov. 23, 2010. U.S. application Ser. No. 13/179,996 is also a continuation-in-part of U.S. application Ser. No. 13/100,580 filed on May 4, 2011. U.S. application Ser. No. 13/179,996 is also a continuation-in-part of U.S. application Ser. No. 13/100,556 filed on May 4, 2011. All aforementioned applications are hereby incorporated by reference in their entirety as if fully cited herein.

TECHNICAL FIELD

Exemplary embodiments generally relate to cooling systems and in particular to cooling systems for electronic displays.

BACKGROUND OF THE ART

Improvements to electronic displays now allow them to be used in outdoor environments for informational, advertising, or entertainment purposes. While displays of the past were primarily designed for operation near room temperature, it is now desirable to have displays which are capable of withstanding large surrounding environmental temperature variations. For example, some displays are capable of operating at temperatures as low as −22 F and as high as 113 F or higher. When surrounding temperatures rise, the cooling of the internal display components can become even more difficult.

Additionally, modern displays have become extremely bright, with some backlights producing 1,000-2,000 nits or more. Sometimes, these illumination levels are necessary because the display is being used outdoors, or in other relatively bright areas where the display illumination must compete with other ambient light. In order to produce this level of brightness, illumination devices and electronic displays may produce a relatively large amount of heat.

Still further, in some situations radiative heat transfer from the sun through a front display surface can also become a source of heat. In some locations 800-1400 Watts/m$^2$ or more through such a front display surface is common. Furthermore, the market is demanding larger screen sizes for displays. With increased electronic display screen size and corresponding front display surfaces, more heat will be generated and more heat will be transmitted into the displays.

Exemplary modern displays have found some effective means for cooling the displays including circulating a closed loop of gas around the display and drawing ambient gas through the display so that the closed loop of gas may be cooled (as well as portions of the electronic display). Various thermal communications have been discovered which can transfer heat away from the sensitive electronic components and out of the display. Heat exchangers were found to produce an excellent means for transferring heat between the closed loop of gas and the ambient gas. However, previous designs for moving the gas through the display have been found to generate an undesirable amount of noise emission from the display as well as thermal gradients where portions of the display were cooled but others remained warm.

When using LCD displays, it was found that backlights were often a source of heat and it was desirable to move gas across the rear surface of the backlight in order to cool it. While desirable, it was thought that the front surface of the backlight could not be cooled for fear that the backlight cavity would become contaminated with dust, dirt, or other particulate.

SUMMARY OF THE EXEMPLARY EMBODIMENTS

Exemplary embodiments use a combination of circulating gas and ambient gas in order to adequately cool an electronic display. Circulating gas may be used to remove heat from the front of the image assembly. When using a LCD as the electronic image assembly, circulating gas may also be used to remove heat from the backlight cavity of the LCD. Because the gas is only circulating within the display, it can remain free of particulate and contaminates and will not harm the display.

Ambient gas may be ingested into the display in order to cool the circulating gas. The ambient gas and the circulating gas may be drawn through a heat exchanger which will allow the heat to transfer from the circulating gas to the ambient gas, preferably without letting the ambient and circulating gases mix with one another. An exemplary embodiment would use a cross-flow heat exchanger. An additional flow of ambient gas can be drawn across the rear surface of the image assembly to remove heat from the rear portion of the image assembly. When using a LCD as the electronic image assembly, this additional flow of ambient gas can be used to remove heat from the rear portion of the backlight for the LCD.

In order to reduce noise emissions, the fans which drive the ambient and/or circulating gas through the heat exchanger may be placed within the heat exchanger, which can then act as a muffler and reduce the noise emitted by the fans. Further, if using the additional ambient gas pathway behind the image assembly, a manifold may be used to collect the ambient gas along an edge of the display and distribute this into a number of smaller flows. The fans for driving this additional ambient gas pathway can be placed within the manifold in order to reduce the noise emitted by the fans and provide an even distribution of ambient gas across the display.

It has been found that ingesting ambient gas from the top or bottom edge of the display is preferable as these edges are not typically observable to the viewer. However, when ingesting ambient gas from the top or bottom of a portrait-oriented display, it has been found that as the cool ambient gas travels across the rear portion of the electronic image assembly and accepts heat it increases in temperature. Once the cooling air reaches the opposite edge (either top or bottom), it may have increased in temperature substantially and may no longer provide adequate cooling to the opposing portion of the display. Thus, the manifolds herein allow for cool ambient air to adequately cool the entire electronic image assembly in an even manner and reduce any 'hot spots' within the electronic image assembly.

In order to further reduce any 'hot spots' within the electronic image assembly, a plurality of temperature sensors can be placed behind the electronic image assembly in order to determine the temperature at various points behind the electronic image assembly. The fans which drive the optional additional ambient gas pathway can be in electrical communication with the temperature sensors so that the rate of air flow created by the fans can be individually adjusted to account for areas within the display that are at an elevated temperature. The efficiency of the display is increased while ensuring a consistent temperature gradient across the electronic image assembly.

The foregoing and other features and advantages will be apparent from the following more detailed description of the particular embodiments of the invention, as illustrated in the accompanying drawings.

BRIEF DESCRIPTION OF THE DRAWINGS

A better understanding of an exemplary embodiment will be obtained from a reading of the following detailed description and the accompanying drawings wherein identical reference characters refer to identical parts and in which.

DETAILED DESCRIPTION

Figure 1A:
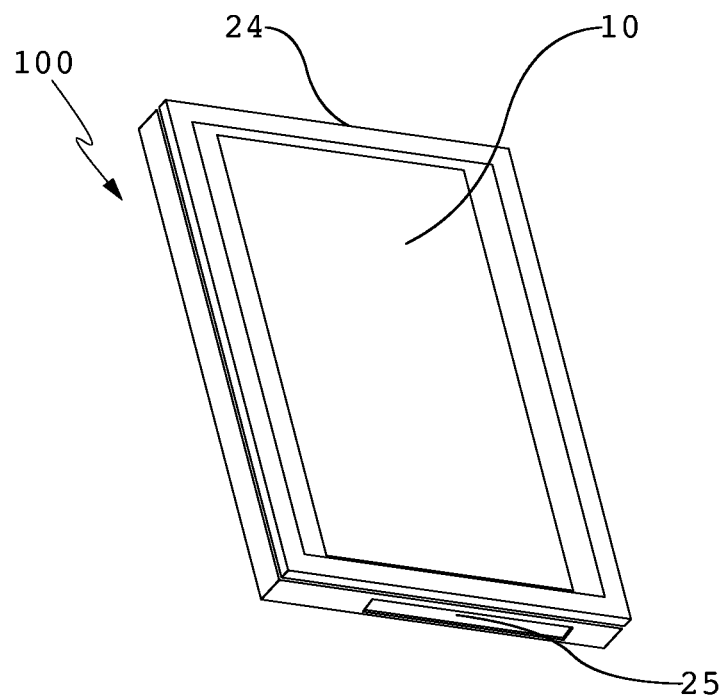
FIG. 1A provides a front perspective view of an exemplary embodiment of the electronic display.

FIG. 1A provides a front perspective view of an exemplary embodiment of the electronic display 100. A transparent front plate 10 is placed on the front portion of the display to protect the internal components and allow the images produced by the display 100 to be seen. Some embodiments may use glass as the transparent front plate 10. Exemplary embodiments may use two pieces of glass laminated with index-matching optical adhesive. Some front plates 10 may provide other utility such as anti-reflection or polarizing functions. An inlet aperture 24 and exit aperture 25 may be provided in the housing so that the display 100 can accept ambient gas for cooling the display 100.

Figure 1B:
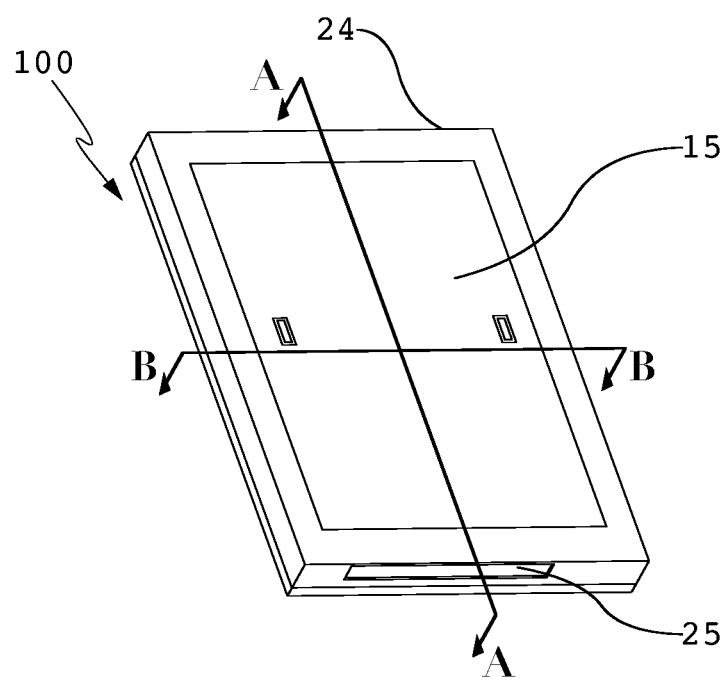
FIG. 1B provides a rear perspective view of an exemplary embodiment of the electronic display.

FIG. 1B provides a rear perspective view of an exemplary embodiment of the electronic display 100. A rear cover 15 may be used to provide access to the internal components of the display 100.

Figure 2:
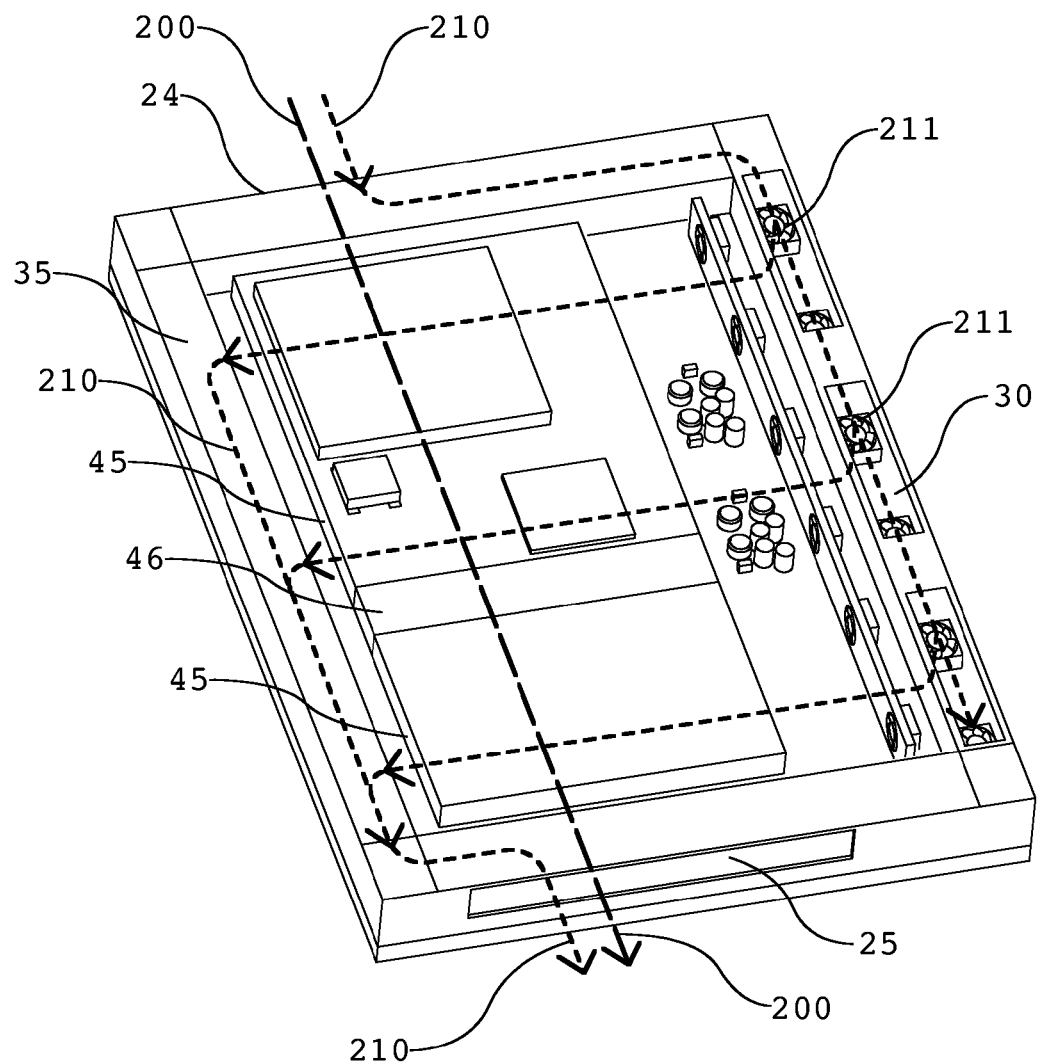
FIG. 2 provides a rear perspective view similar to that shown in FIG. 1B where the rear cover has been removed.

FIG. 2 provides a rear perspective view similar to that shown in FIG. 1B where the rear cover 15 has been removed. Ambient gas 200 may be ingested into the display through the inlet aperture 24 and pass through a heat exchanger 45 and exit the display through the exit aperture 25. The ambient gas 200 may be drawn into the display and forced through the heat exchanger 45 using heat exchanger fan assembly 46. An exemplary placement for the heat exchanger fan assembly 46 is discussed further below, but in many embodiments the fan assembly 46 can be placed near the inlet aperture 24 and/or exit aperture 25 and may or may not be placed within the heat exchanger 45 (as shown in FIG. 2).

Optionally, ambient gas 210 may also be ingested into the display through inlet aperture 24. Ambient gas 210 may then be directed through a first manifold 30 which travels along the edge of the display. The first manifold 30 accepts the single larger inlet flow of ambient gas 210 and distributes it into a plurality of smaller flows across the display. A second manifold 35 may be placed along the opposite edge of the display as the first manifold 30. The second manifold 35 accepts the plurality of smaller flows and combines them into a single flow and exhausts it out of the exit aperture 25. In this embodiment, a manifold fan assembly 211 is used to draw the ambient gas 210 into the inlet aperture 24 and force the ambient gas 210 across the display. For this particular embodiment, the manifold fan assembly 211 is placed within the first manifold 30 and is used to draw the ambient gas 210 into the display as well as distribute the single flow into a plurality of smaller flows. This is not required however, as some embodiments may place the manifold fan assembly 211 in the second manifold 35, or within both the first and second manifolds 30 and 35.

While both flows of ambient gas may be used in an exemplary embodiment, there is no requirement that they are both used. Some embodiments may use only ambient gas 200 or ambient gas 210. Also, if using both flows of ambient gas 200 and ambient gas 210 there is no requirement that they share the same inlet and exit apertures. Thus, there may be separate inlet and exit apertures for the two flows of ambient gas.

Figure 3:
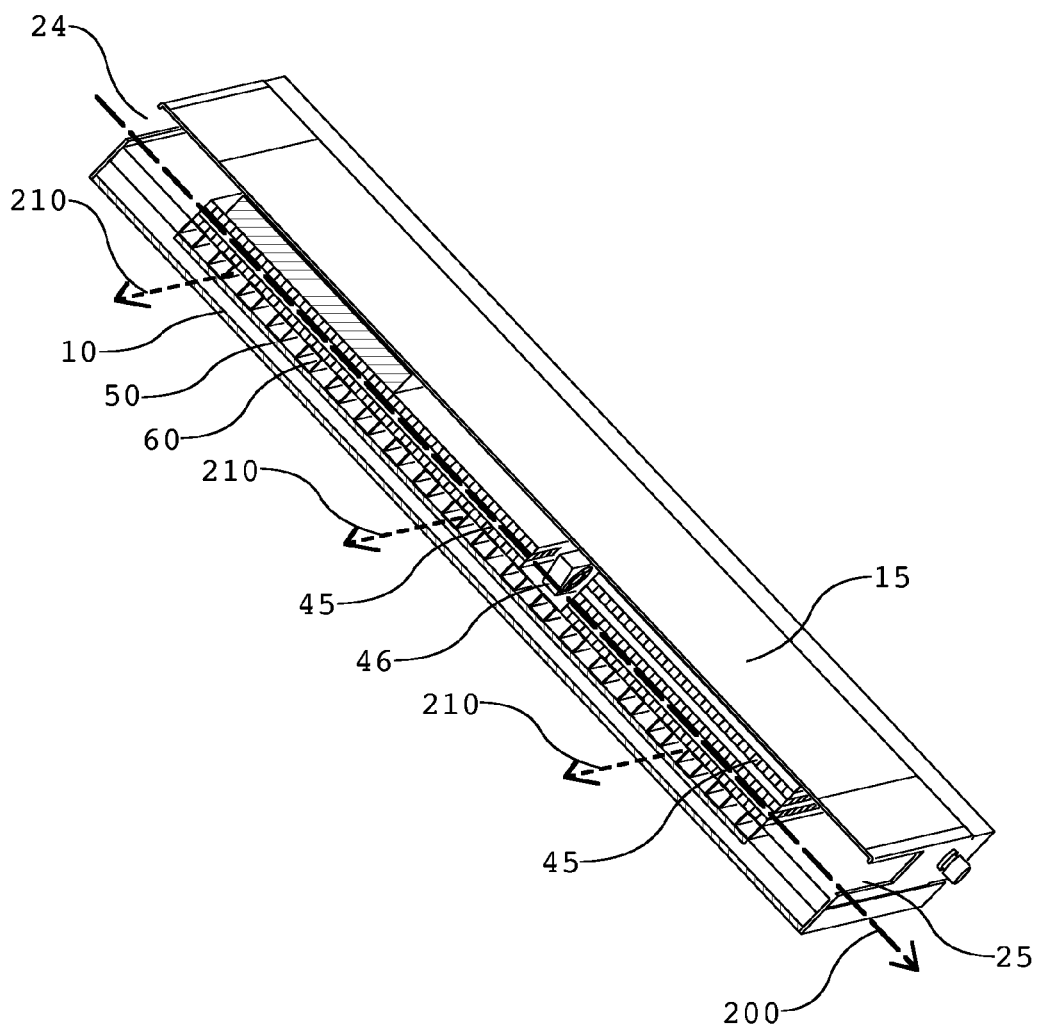
FIG. 3 provides a perspective sectional view along the A-A section line shown in FIG. 1B.

FIG. 3 provides a perspective sectional view along the A-A section line shown in FIG. 1B. Again, ambient gas 200 may be ingested into the display through the inlet aperture 24 and pass through a heat exchanger 45 and exit the display through the exit aperture 25. The ambient gas 200 may be drawn into the display and forced through the heat exchanger 45 using heat exchanger fan assembly 46. Obviously, the inlet aperture 24 may contain a filter or other coverings so that contaminates, insects, garbage, and/or water/fluids cannot easily be ingested into the display. However, an exemplary embodiment would not be damaged if the ambient gas 200 contained contaminates as they would only pass through the heat exchanger 45 which may not be susceptible to damage from particulate or contaminates. Exit aperture 25 may also contain some type of covering to ensure that contaminates and/or insects could not enter the display.

An electronic image assembly 50 may be placed behind the front plate 10. A plurality of channels 60 may be placed immediately behind the electronic image assembly 50. Ambient gas 210 may be forced through the channels 60 after travelling through the first manifold 30 (not shown here). The flow of ambient gas 210 immediately behind the electronic image assembly 50 may be used to remove any buildup of heat from the rear portion of the electronic image assembly

50. It may be preferable to have a thermally conductive surface on the rear portion of the electronic image assembly 50 so that heat can easily transfer to this plate and be removed by the ambient gas 210.

The channels 60 can take on any number of forms. Although shown in this embodiment with a square cross-section this is not required. Other embodiments may contain channels 60 with I-beam cross-sections, hollow square cross-sections, hollow rectangular cross-section, solid rectangular or solid square cross-sections, 'T' cross-sections, 'Z' cross-sections, a honeycomb cross-section, or any combination or mixture of these. The channels 60 are preferably thermally conductive and also preferably in thermal communication with the electronic image assembly 50. Thus, in a preferred embodiment, heat which accumulates on the rear portion of the electronic image assembly 50 may be transferred throughout the channels 60 and removed by ambient gas 210.

Figure 4:
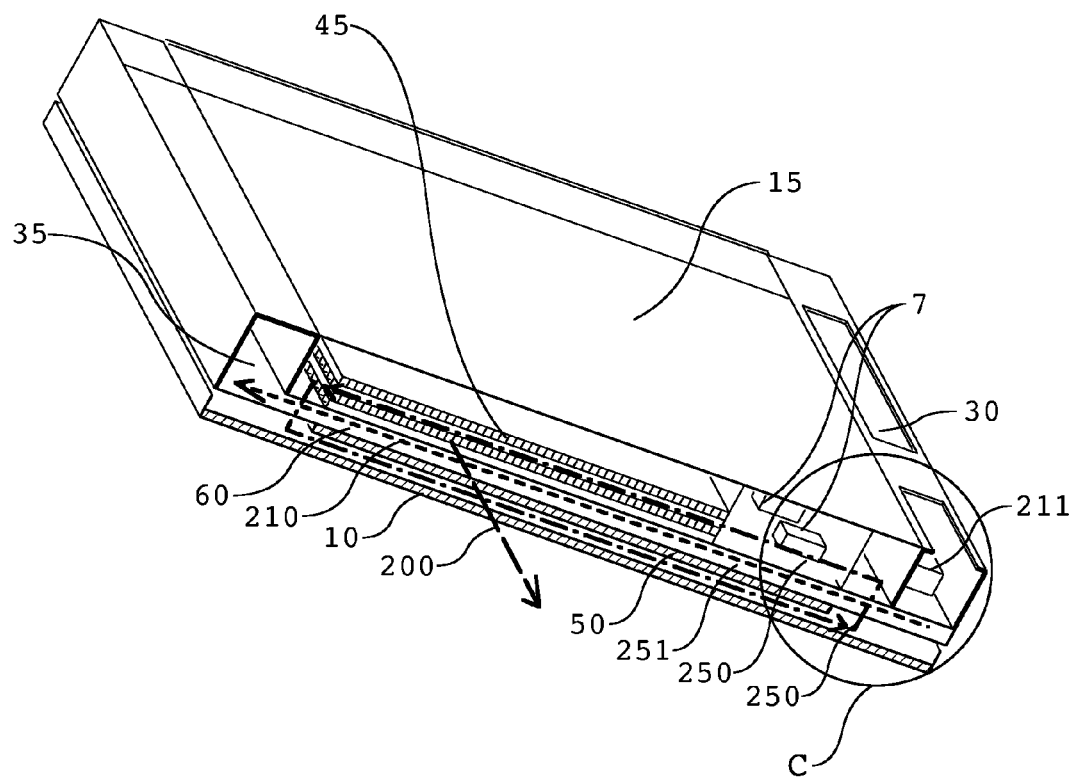
FIG. 4 provides a perspective sectional view along the B-B section line shown in FIG. 1B.

FIG. 4 provides a perspective sectional view along the B-B section line shown in FIG. 1B. In this view, the path of the circulating gas 250 can also be observed. The space between the front plate 10 and the electronic image assembly 50 may define a front channel 251, through which the circulating gas 250 may travel in order to remove any accumulation of heat on the front surface of the electronic image assembly 50. The circulating gas 250 is preferably then directed into the heat exchanger 45 where heat may be transferred from the circulating gas 250 to the ambient gas 200. Upon exiting the heat exchanger 45, the circulating gas 250 may be re-directed into the front channel 251. The circulating gas 250 may also be directed over various electronic components 7 so that heat may be transferred from the electronic components 7 to the circulating gas 250. The electronic components 7 could be any one of the following but not limited to: power modules, heat sinks, capacitors, motors, microprocessors, hard drives, AC/DC converters, transformers, or printed circuit boards.

Also shown in this sectional view is the path of the ambient gas 210 travelling down one of the channels 60 directly behind the electronic image assembly 50. In this embodiment, the ambient gas 210 is forced out of the first manifold 30, across the channels 60, and into the second manifold 35 by manifold fan assembly 211. As shown in this Figure, the paths of the ambient gas 210 and the circulating gas 250 will likely cross, but it is preferable to keep the two gases from mixing (as the ambient gas 210 may contain particulate or contaminates while the circulating gas 250 can remain substantially free of particulate and contaminates). It may be preferable to keep the circulating gas 250 from having particulate or contaminates because it travels in front of the electronic image assembly 50. Thus, to keep the image quality from being impaired, it may be desirable to keep the circulating gas 250 clean and prevent it from mixing with the ambient gas 210.

Figure 5:
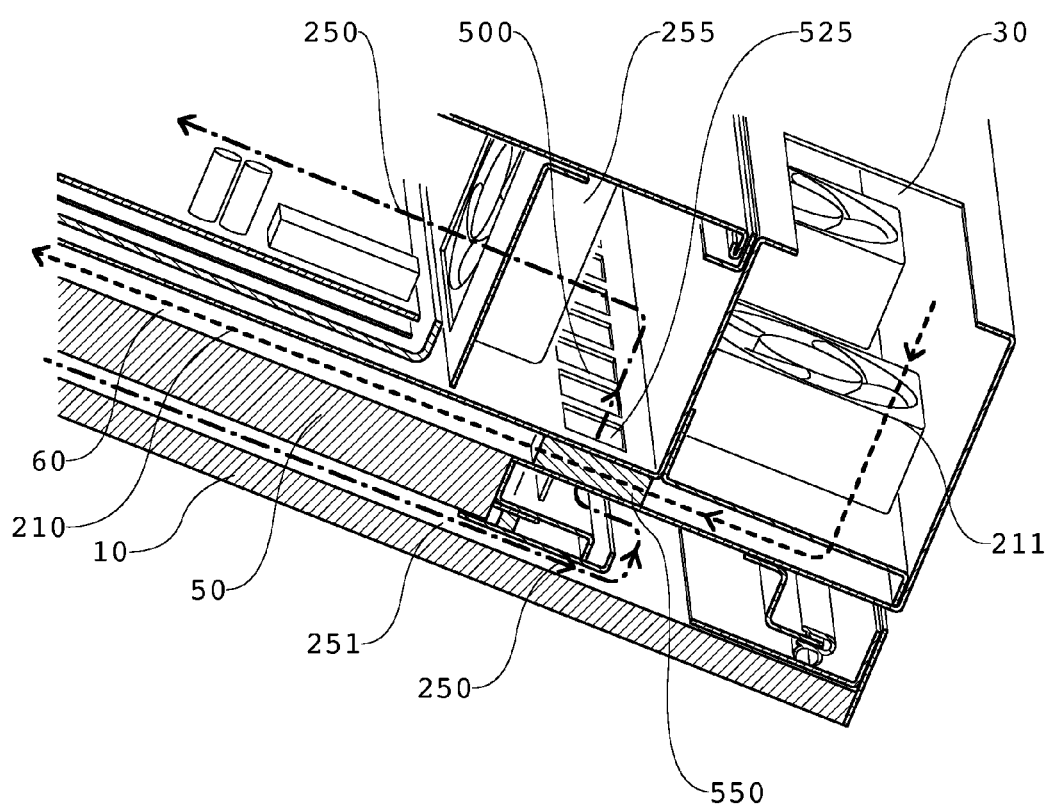
FIG. 5 provides a perspective sectional view of insert C shown in FIG. 4.

FIG. 5 provides a perspective sectional view of insert C shown in FIG. 4. As noted above, if practicing an embodiment which uses ambient gas 210 as well as the circulating gas 250, the pathways of the two gases may need to cross over one another and it may be desirable to prohibit them from mixing to prevent contamination of sensitive portions of the display. Here, cross through plate 500 allows the pathways of the two gases to cross over one another without letting them mix together. The cross through plate 500 in this embodiment contains a series of voids which pass through the plate. A first series of voids 550 passes through the cross through plate 500 and allows ambient gas 210 to travel from the first manifold 30 into the channels 60 which run behind the electronic image assembly 50. A second series of voids 525 pass through the cross through plate 500 in a direction substantially perpendicular to that of the first series of voids 550. The second series of voids 525 allows the circulating gas to exit the front channel 251, cross over the ambient gas 210, and continue towards the heat exchanger 45. In this embodiment, a circulating gas fan assembly 255 is used to draw the circulating gas 250 through the front channel 251 and through the heat exchanger 45. Much like the other fan assemblies shown and described here, the circulating gas fan assembly 255 could be placed anywhere within the display, including but not limited to the entrance/exit of the heat exchanger 45 or the entrance/exit of the front channel 251.

Figure 6:
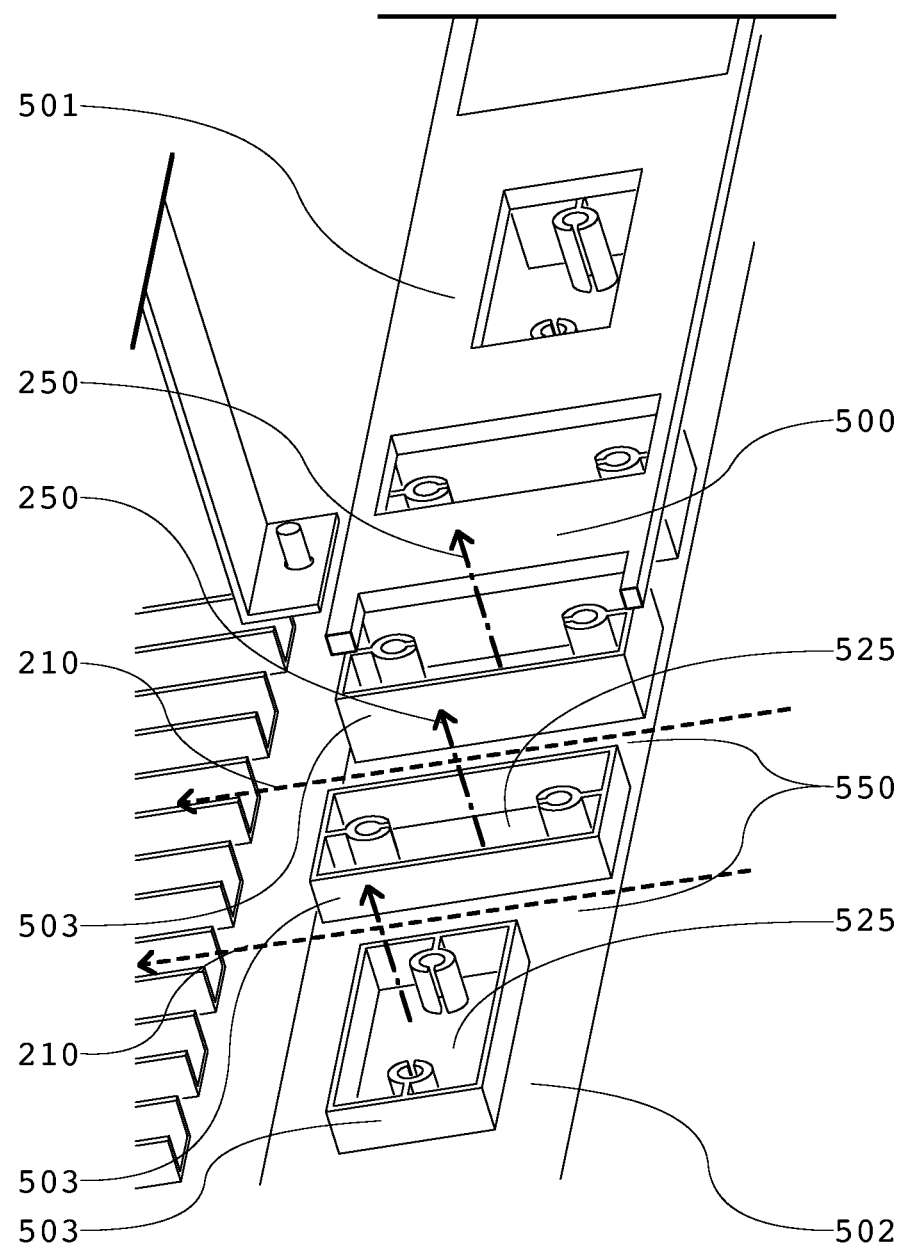
FIG. 6 provides a perspective sectional view of one embodiment of the cross through plate.

FIG. 6 provides a perspective sectional view of one embodiment of the cross through plate 500. In this embodiment, the cross through plate 500 is comprised of a plurality of hollow blocks 503 sandwiched between a top plate 501 and bottom plate 502 with sections of the plates 501 and 502 removed to correspond with the hollow sections of the blocks 503. A portion of the top plate 501 has been removed to show the detail of the hollow blocks 503, first series of voids 550, and second series of voids 525. The cross through plate 500 could take on any number of forms and could be constructed in a number of ways. Some other embodiments may use a solid plate where the first and second series of voids 550 and 525 are cut out of the solid plate. Other embodiments could use two sets of hollow blocks where the hollow sections are perpendicular to each other and the blocks are fastened together. Still other embodiments could use a design similar to those that are taught below for the heat exchanger 45, for example any type of cross-flow heat exchanger design could be used.

Figure 7:
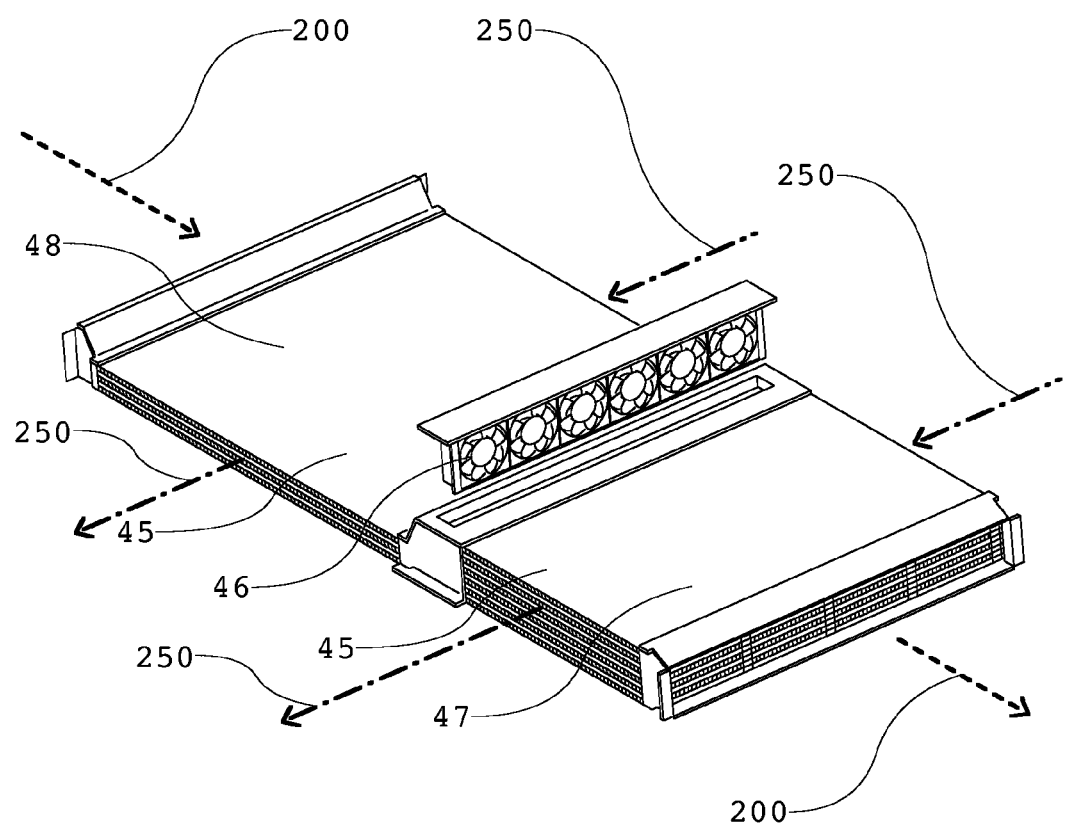
FIG. 7 provides an exploded perspective view of one embodiment of the heat exchanger.

FIG. 7 provides an exploded perspective view of one embodiment of the heat exchanger 45. In this view, the heat exchanger fan assembly 46 is shown removed from its mounted position within the heat exchanger 45. In this embodiment, the heat exchanger 45 is divided into two sections 47 and 48 where the fan assembly 46 is placed between the two sections 47 and 48. While the fan assembly 46 can be placed anywhere so that it draws ambient gas 200 through the heat exchanger 45, it has been found that placing the fan assembly 46 between the two sections of the heat exchanger can provide a number of benefits. First, the volumetric flow rate of the ambient gas 200 through the heat exchanger is high, which results in better cooling capabilities for the heat exchanger 45. Second, the noise produced by the fan assembly 46 can be drastically reduced because the surrounding sections 47 and 48 of the heat exchanger 45 essentially act as a muffler for the fan assembly 46. In this embodiment, section 48 is thinner and longer than section 47. This was done in order to free up more space within the housing so that additional electronic components could fit within the housing (adjacent to section 48). This design may be preferable when it is desirable to create the largest possible heat exchanger 45 (for maximum cooling abilities). This is of course not required, and other embodiments may have sections which are of equal width and length. Also, although this embodiment uses the fan assembly 46 to drive the ambient gas 200, other embodiments could use a fan assembly placed within the heat exchanger to drive the circulating gas 250 instead and drive the ambient gas 200 with another fan assembly (possibly placed within the heat exchanger or located at the entrance/exit of the heat exchanger).

The ambient gas 200 travels through a first pathway (or plurality of pathways) of the heat exchanger 45 while the circulating gas 250 travels through a second pathway (or plurality of pathways) of the heat exchanger 45. Although not required, it is preferable that the circulating gas 250 and ambient gas 200 do not mix. This may prevent any contaminates and/or particulate that is present within the ambient gas 200 from harming the interior of the display. In a preferred embodiment, the heat exchanger 45 would be a cross-flow heat exchanger. However, many types of heat exchangers are known and can be used with any of the embodiments herein. The heat exchanger 45 may be a cross-flow, parallel flow, or counter-flow heat exchanger. In an exemplary embodiment, the heat exchanger 45 would be comprised of a plurality of stacked layers of thin plates. The plates may have a corrugated, honeycomb, or tubular design, where a plurality of channels/pathways/tubes travel down the plate length-wise. The plates may be stacked such that the directions of the pathways are alternated with each adjacent plate, so that each plate's pathways are substantially perpendicular to the pathways of the adjacent plates. Thus, ambient gas or circulating gas may enter an exemplary heat exchanger only through plates whose channels or pathways travel parallel to the path of the gas. Because the plates are alternated, the circulating gas and ambient gas may travel in plates which are adjacent to one another and heat may be transferred between the two gases without mixing the gases themselves (if the heat exchanger is adequately sealed, which is preferable but not required).

In an alternative design for a heat exchanger, an open channel may be placed in between a pair of corrugated, honeycomb, or tubular plates. The open channel may travel in a direction which is perpendicular to the pathways of the adjacent plates. This open channel may be created by running two strips of material or tape (esp. very high bond (VHB) tape) between two opposite edges of the plates in a direction that is perpendicular to the direction of the pathways in the adjacent plates. Thus, gas entering the heat exchanger in a first direction may travel through the open channel (parallel to the strips or tape). Gas which is entering in a second direction (substantially perpendicular to the first direction) would travel through the pathways of the adjacent plates).

Other types of cross-flow heat exchangers could include a plurality of tubes which contain the first gas and travel perpendicular to the path of the second gas. As the second gas flows over the tubes containing the first gas, heat is exchanged between the two gases. Obviously, there are many types of cross-flow heat exchangers and any type would work with the embodiments herein.

An exemplary heat exchanger may have plates where the sidewalls have a relatively low thermal resistance so that heat can easily be exchanged between the two gases. A number of materials can be used to create the heat exchanger. Preferably, the material used should be corrosion resistant, rot resistant, light weight, and inexpensive. Metals are typically used for heat exchangers because of their high thermal conductivity and would work with these embodiments. However, it has been discovered that plastics and composites can also satisfy the thermal conditions for electronic displays. An exemplary embodiment would utilize polypropylene as the material for constructing the plates for the heat exchanger. It has been found that although polypropylene may seem like a poor thermal conductor, the large amount of surface area relative to a small sidewall thickness, results in an overall thermal resistance that is low. Thus, an exemplary heat exchanger would be made of plastic and would thus produce a display assembly that is thin and lightweight. Specifically, corrugated plastic may be used for each plate layer where they are stacked together in alternating fashion (i.e. each adjacent plate has channels which travel in a direction perpendicular to the surrounding plates).

Figure 8:
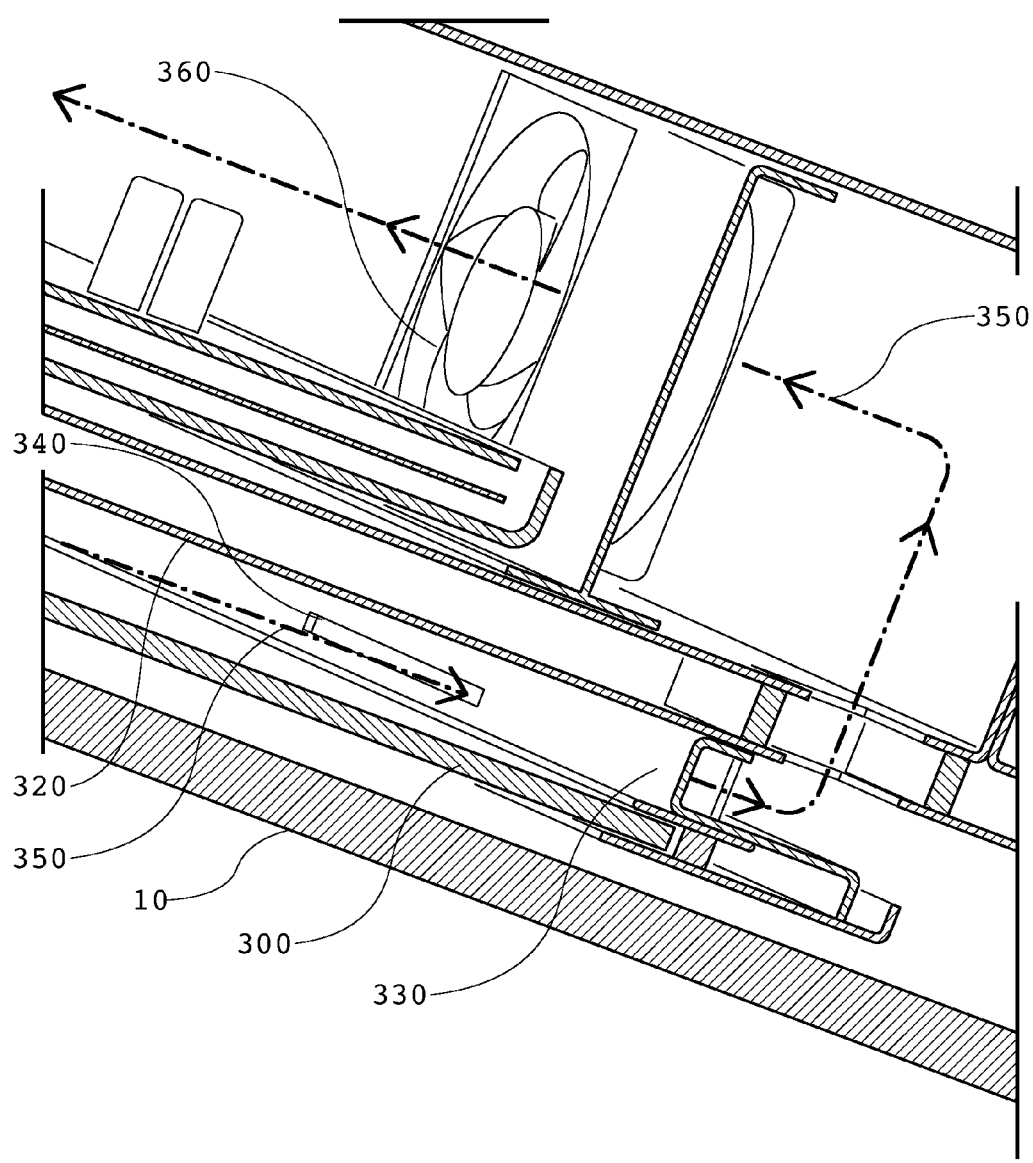
FIG. 8 provides a perspective sectional view of another embodiment which uses a flow of circulating gas through the backlight cavity of a liquid crystal display (LCD).

FIG. 8 provides a perspective sectional view of another embodiment which uses a flow of circulating gas 350 through the backlight cavity of a liquid crystal display (LCD) 300. In this embodiment, a LCD 300 and an associated backlight 320 are used as the electronic image assembly. A backlight wall 330 may be placed between the LCD 300 and the backlight 320 in order to enclose the area and create a backlight cavity. Typically, the backlight cavity is closed to prevent contaminates/particulate from entering the backlight cavity and disrupting the optical/electrical functions of the backlight 320. However, as discussed above the exemplary embodiments may use a clean gaseous matter for the circulating gases which could now be used to ventilate the backlight cavity in order to cool the backlight 320 and even the rear portion of the LCD 300. An opening 340 can be placed in the backlight wall 330 to allow circulating gas 350 to flow through the backlight cavity. A fan assembly 360 may be used to draw the circulating gas 350 through the backlight cavity. In an exemplary embodiment there would be an opening on the opposing backlight wall (on the opposite side of the display as shown in this figure) so that circulating gas 350 could easily flow through the backlight cavity.

Figure 9:
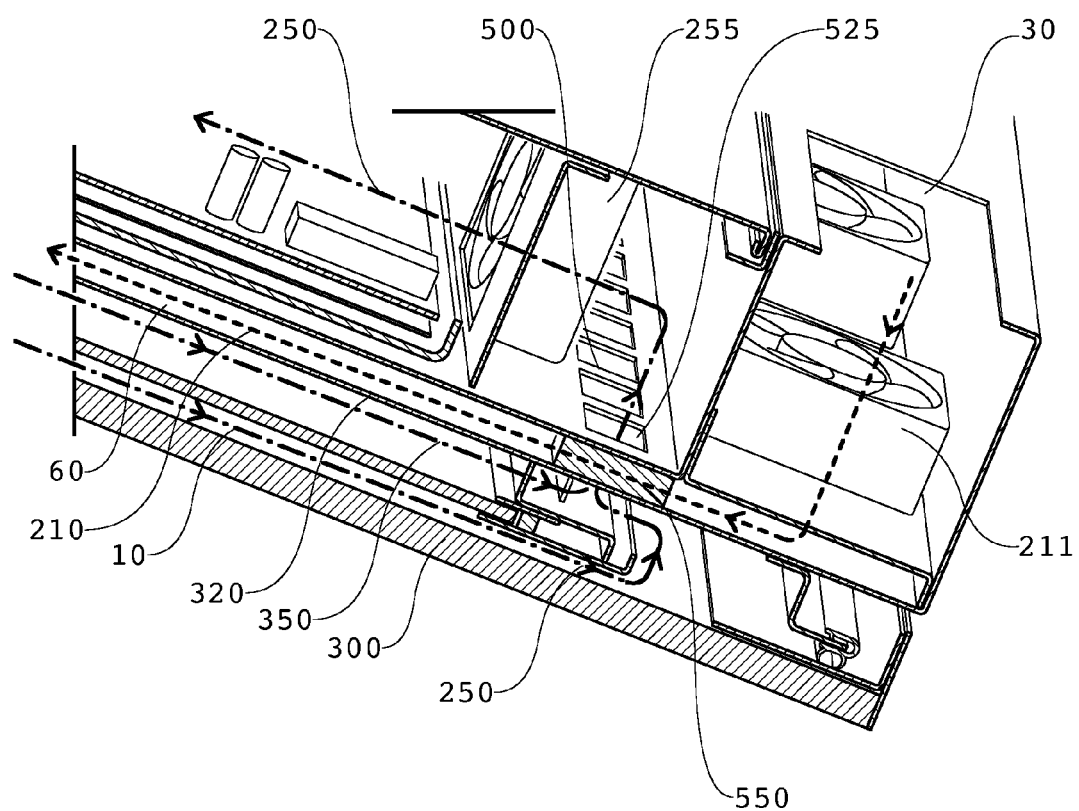
FIG. 9 provides a perspective sectional view of an exemplary embodiment which uses a flow of circulating gas through the backlight cavity in addition to the flow of circulating gas between the LCD and front plate.

FIG. 9 provides a perspective sectional view of an exemplary embodiment which uses a flow of circulating gas 350 through the backlight cavity in addition to the flow of circulating gas 250 between the LCD 300 and front plate 10. Circulating fan assembly 255 may be placed so that it can draw circulating gas 350 through the backlight cavity as well as circulating gas 250 between the LCD 300 and the front plate 10. As discussed above, the circulating gases 250 and 350 are preferably forced through the heat exchanger 45 (not shown in this figure) so that they may be cooled by the ambient gas 200 (also not shown in this figure).

Also shown in FIG. 9 is the optional additional flow of ambient gas 210 which may travel immediately behind the backlight 320. Once travelling through the first manifold 30, the ambient gas 210 may pass through the channels 60 in order to remove heat from the backlight 320 and even the channels 60 themselves (if they are thermally conductive). The manifold fan assembly 211 may be used to draw the ambient gas 210 into the first manifold 30 and through the channels 60. Again, the cross though plate 500 may be used to allow the circulating gases 350 and 250 to cross paths with the ambient gas 210 without letting the two gases mix.

Figure 10:
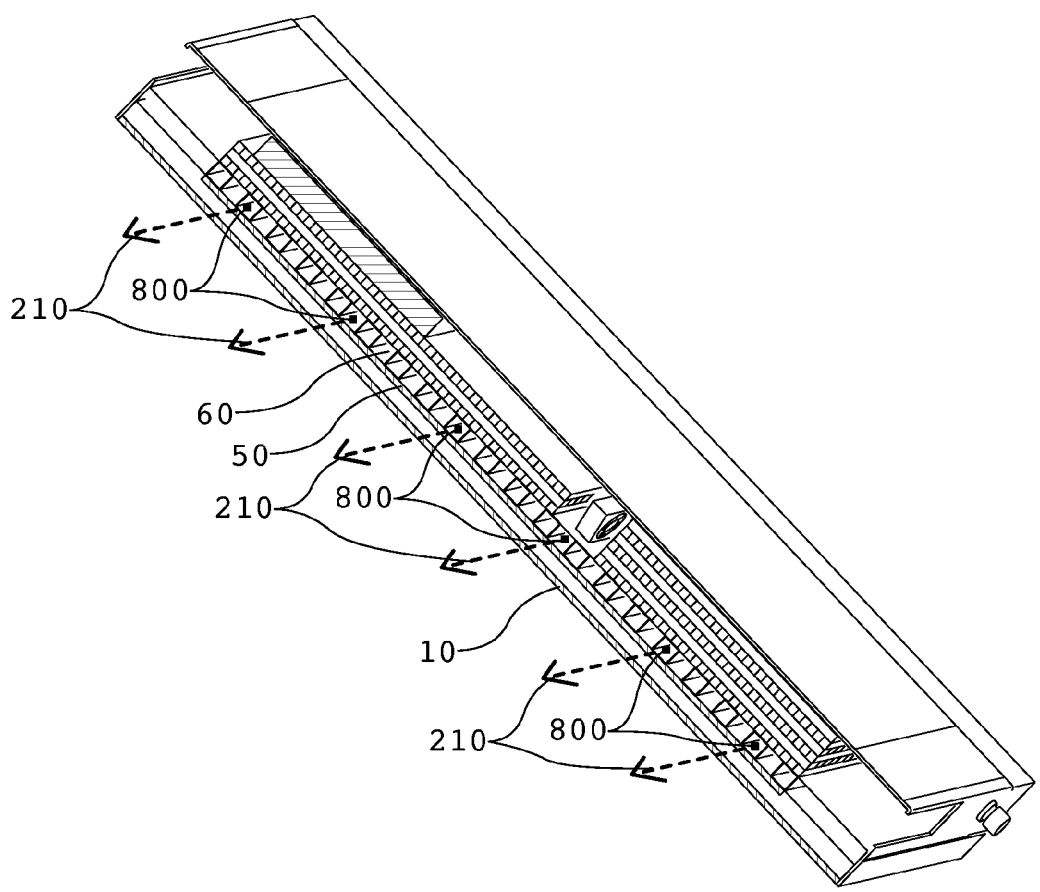
FIG. 10 provides a perspective sectional view along the A-A section line shown in FIG. 1B showing an embodiment with temperature sensors within the channels which may be placed immediately behind the electronic image assembly.

FIG. 10 provides a perspective sectional view along the A-A section line shown in FIG. 1B showing an embodiment with temperature sensors 800 within the channels 60 which may be placed immediately behind the electronic image assembly 50. It has been found that different portions of the electronic image assembly 50 and/or channels 60 may be warmer than others. This can be due to sunlight which contacts only a portion of the display, heat transfer from power supplies (depending on their location), and the general propensity for heat to rise. By placing temperature sensors 800 within the channels 60, it is possible to measure the temperature at many different places within the display and adjust the flow rate for the various fans to accommodate the temperature measurements. It may be preferable to place each temperature sensor 800 in the air flow pathway for a corresponding fan so that temperature feedback can be adequately addressed by the appropriate fan.

Figure 11:
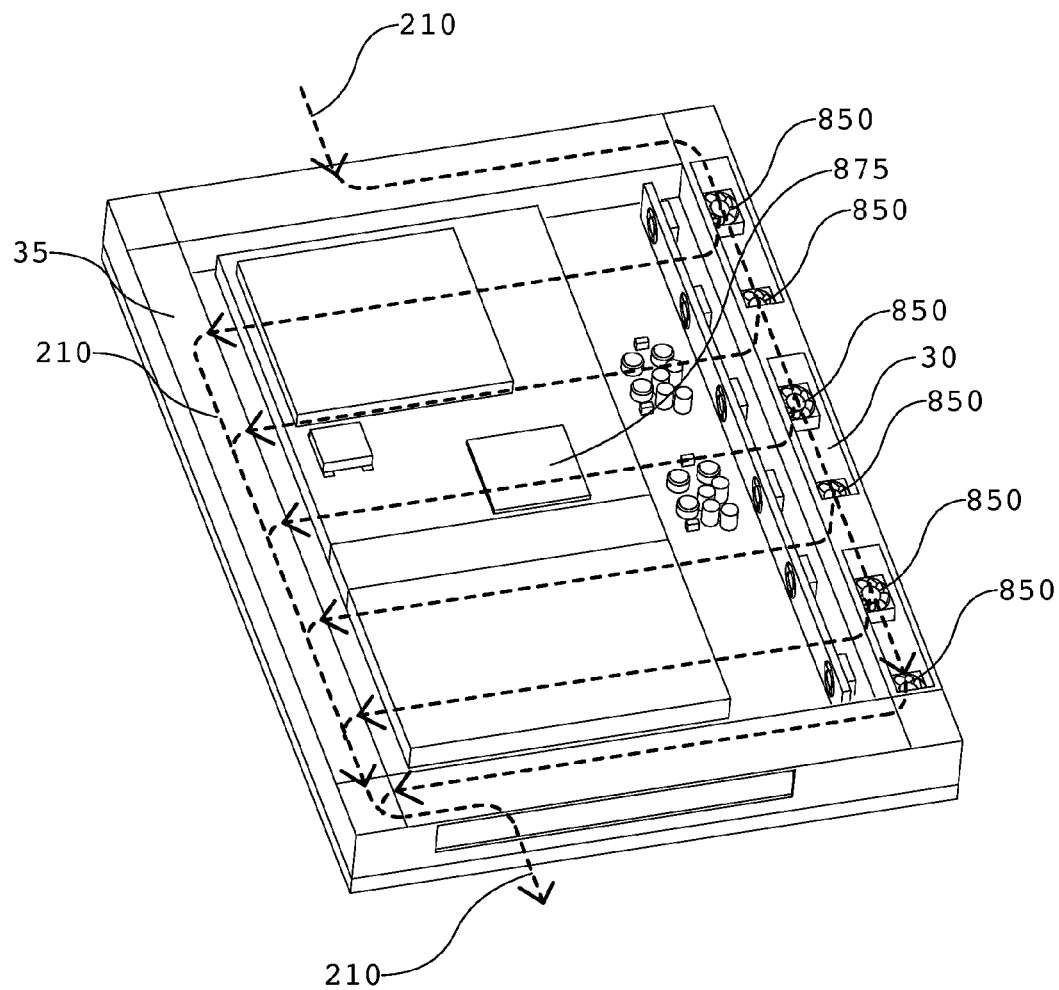
FIG. 11 provides a rear perspective view similar to that shown in FIG. 1B where the rear cover has been removed showing an embodiment where each fan is individually controlled based on the temperature sensor data.

FIG. 11 provides a rear perspective view similar to that shown in FIG. 1B where the rear cover has been removed showing an embodiment where each fan 850 is individually controlled based on the data from temperature sensors 800. For this particular embodiment, there is one fan 850 for each temperature sensor 800. Further for this particular embodiment, each temperature sensor 800 is placed in the air flow pathway for each corresponding fan 850. This is not required however, as other embodiments may place multiple temperature sensors within the air flow pathway of one fan or multiple fans may be forcing cooling air across a single temperature sensor.

The temperature sensors 800 and fans 850 may be in electrical communication with a microcontroller, CPU, and/or microprocessor 875. Many types of these devices are commonly available and known in the art, including but not limited to Field-programmable gate array (FPGA), field-programmable analog array (FPAA), application-specific integrated circuit (ASIC), programmable read-only memory (PROM), programmable logic devices (PLDs), complex programmable logic device (CPLD), and any other electrical device which is capable of executing logic commands. A desired operating temperature range can be selected and the fans 850 may be individually engaged for only the regions which require cooling (as indicated by the temperature sensors 800). This embodiment allows the display for further reduce any 'hot spots' and accurately control the cooling of the display in an efficient manner.

In an exemplary embodiment, the backlight 320 would contain a plurality of LEDs mounted on a thermally conductive substrate (preferably a metal core PCB). On the surface of the thermally conductive substrate which faces the channels 60 there may be a thermally conductive front plate which may be in thermal communication with the channels 60. In an exemplary embodiment, the thermally conductive plate would be metallic and more preferably aluminum.

As noted above, many electronic image assemblies (especially LEDs, LCDs, and OLEDs) may have performance properties which vary depending on temperature. When 'hot spots' are present within an image assembly, these hot spots can result in irregularities in the resulting image which might be visible to the end user. Thus, with the embodiments described herein, the heat which may be generated by the image assembly (sometimes containing a backlight assembly) can be distributed (somewhat evenly) throughout the channels 60 and thermally-conductive surfaces to remove hot spots and cool the backlight and/or electronic image assembly.

The circulating gases 250 and 350, ambient gas 200, and optional ambient gas 210 can be any number of gaseous matters. In some embodiments, air may be used as the gas for all. Preferably, because the circulating gases 250 and 350 are in front of the image assembly and backlight respectively, they should be substantially clear, so that they will not affect the appearance of the image to a viewer. The circulating gases 250 and 350 should also preferably be substantially free of contaminates and/or particulate (ex. dust, dirt, pollen, water vapor, smoke, etc.) in order to prevent an adverse effect on the image quality and/or damage to the internal electronic components. It may sometimes be preferable to keep ambient gases 200 and 210 from having contaminates as well. Filters may be used to help reduce the particulate within ambient gases 200 and 210. Filters could be placed near the inlet aperture 24 so that ambient gases 200 and/or 210 could be drawn through the filter. However, in an exemplary embodiment the display may be designed so that contaminates could be present within the ambient gases 200 and 210 but this will not harm the display. In these embodiments, the heat exchanger 45, manifolds 30 and 35, channels 60, and any other pathway for ambient or circulating gas should be properly sealed so that any contaminates in the ambient gas would not enter sensitive portions of the display. Thus, in these exemplary embodiments, ingesting ambient air for the ambient gases 200 and 210, even if the ambient air contains contaminates, will not harm the display. This can be particularly beneficial when the display is used in outdoor environments or indoor environments where contaminates are present in the ambient air.

The cooling system may run continuously. However, if desired, temperature sensing devices may be incorporated within the electronic display to detect when temperatures have reached a predetermined threshold value. In such a case, the various cooling fans may be selectively engaged when the temperature in the display reaches a predetermined value. Predetermined thresholds may be selected and the system may be configured to advantageously keep the display within an acceptable temperature range. Typical thermostat assemblies can be used to accomplish this task. Thermocouples may be used as the temperature sensing devices.

It is to be understood that the spirit and scope of the disclosed embodiments provides for the cooling of many types of displays. By way of example and not by way of limitation, embodiments may be used in conjunction with any of the following electronic image assemblies: LCD (all types), light emitting diode (LED), organic light emitting diode (OLED), field emitting display (FED), light emitting polymer (LEP), organic electro luminescence (OEL), plasma displays, and any other thin panel electronic image assembly. Furthermore, embodiments may be used with displays of other types including those not yet discovered. In particular, it is contemplated that the system may be well suited for use with full color, flat panel OLED displays. Exemplary embodiments may also utilize large (55 inches or more) LED backlit, high definition liquid crystal displays (LCD). While the embodiments described herein are well suited for outdoor environments, they may also be appropriate for indoor applications (e.g., factory/industrial environments, spas, locker rooms) where thermal stability of the display may be at risk.

As is well known in the art, electronic displays can be oriented in a portrait manner or landscape manner and either can be used with the embodiments herein.

Having shown and described preferred embodiments, those skilled in the art will realize that many variations and modifications may be made to affect the described embodiments and still be within the scope of the claimed invention. Additionally, many of the elements indicated above may be altered or replaced by different elements which will provide the same result and fall within the spirit of the claimed invention. It is the intention, therefore, to limit the invention only as indicated by the scope of the claims.

We claim:

1. A system for cooling an electronic image assembly comprising:
   a plurality of ambient gas pathways positioned behind the electronic image assembly;
   a first fan positioned to force cooling gas through a first grouping of ambient gas pathways;
   a second fan positioned to force cooling gas through a second grouping of ambient gas pathways;
   a first temperature sensing device positioned to measure the temperature of one or more of the ambient gas pathways in the first grouping;
   a second temperature sensing device positioned to measure the temperature of one or more of the ambient gas pathways in the second grouping; and
   a microprocessor in electrical communication with the fans and temperature sensing devices.

2. The cooling system of claim 1 further comprising:
   a third fan positioned to force cooling gas through a third grouping of ambient gas pathways;

a third temperature sensing device positioned to measure the temperature of one or more of the ambient gas pathways in the third grouping; and wherein the microprocessor is in electrical communication with the third fan and third temperature sensing device.

3. The cooling system of claim 1 wherein:
the ambient gas pathways are in conductive thermal communication with the electronic image assembly.

4. The cooling system of claim 1 further comprising:
a transparent front plate placed in front of the electronic image assembly, the space between the front plate and the electronic image assembly defining a circulating gas pathway;
a circulating fan position to force circulating gas through the circulating gas pathway; and
a pass through plate having a first pass through for ambient gas travelling through the ambient gas pathways and a second pass through for circulating gas.

5. The cooling system of claim 1 further comprising:
a first manifold in gaseous communication with each ambient gas pathway, and arranged to accept ambient gas and distribute ambient gas to each ambient gas pathway; and
a second manifold in gaseous communication with each ambient gas pathway and arranged to accept ambient gas from each ambient gas pathway and direct the ambient gas towards an exhaust.

6. The cooling system of claim 1 wherein:
the ambient gas pathways are metallic ducts.

7. The cooling system of claim 5 wherein:
the first and second fans are positioned within the first manifold to push the ambient gas through the ambient gas pathways.

8. The cooling system of claim 5 wherein:
the first and second fans are positioned within the second manifold to pull the ambient gas through the ambient gas pathways.

9. A system for cooling a first and second rear portion of an electronic image assembly, the system comprising:
a first plurality of cooling ducts placed behind the first rear portion of the electronic image assembly;
a second plurality of cooling ducts placed behind the second rear portion of the electronic image assembly;
a manifold in gaseous communication with each cooling duct;
a first temperature measurement device positioned to measure a temperature near the first rear portion of the electronic display;
a second temperature measurement device positioned to measure the temperature near the second rear portion of the electronic display;
a first fan positioned to force cooling gas through the first plurality of cooling ducts;
a second fan positioned to force cooling gas through the second plurality of cooling ducts; and
a means for controlling the speed of the first fan in response to data from the first temperature measurement device and controlling the speed of the second fan in response to data from the second temperature measurement device.

10. The cooling system of claim 9 wherein:
the cooling ducts are in conductive thermal communication with the electronic image assembly.

11. The cooling system of claim 9 wherein:
the manifold is placed along a vertical edge of the electronic image assembly.

12. The cooling system of claim 9 wherein:
the fans are placed within the manifold.

13. The cooling system of claim 9 wherein:
the means for controlling the speed of the first fan in response to data from the first temperature measurement device is a computer processor.

14. The cooling system of claim 9 further comprising:
a front plate placed in front of the electronic image assembly, the space between the front plate and the electronic image assembly defining a circulating gas pathway;
a circulating fan position to force circulating gas through the circulating gas pathway; and
a pass through plate having a first pass through for ambient gas and a second pass through for circulating gas.

15. The cooling system of claim 14 wherein:
the first and second pass throughs do not allow the ambient gas and circulating gas to mix.

16. The cooling system of claim 9 wherein:
the electronic image assembly is a liquid crystal display.

17. A method for cooling an electronic image assembly having a plurality of cooling gas pathways placed behind the electronic image assembly, a first fan positioned to force cooling gas through a first grouping of cooling gas pathways, and a second fan positioned to force cooling gas through a second grouping of cooling gas pathways, the method comprising the steps of:
measuring the temperature T1 of the first grouping of cooling gas pathways;
measuring the temperature T2 of the second grouping of cooling gas pathways;
increasing the speed of the first fan if T1 is greater than T2; and
increasing the speed of the second fan if T2 is greater than T1.

18. A method for cooling an electronic image assembly having a plurality of cooling gas pathways placed behind the electronic image assembly where the cooling gas pathways have a desired operating temperature range, a first fan positioned to force cooling gas through a first grouping of cooling gas pathways, a second fan positioned to force cooling gas through a second grouping of cooling gas pathways, and a third fan positioned to force cooling gas through a third grouping of cooling gas pathways, the method comprising the steps of:
measuring the temperature T1 of the first grouping of cooling gas pathways;
measuring the temperature T2 of the second grouping of cooling gas pathways;
measuring the temperature T3 of the third grouping of cooling gas pathways;
increasing the speed of the first fan if T1 is higher than the desired operating temperature range;
increasing the speed of the second fan if T2 is higher than the desired operating temperature range; and
increasing the speed of the third fan if T3 is higher than the desired operating temperature range.

19. The method of claim 18 further comprising the steps of:
decreasing the speed of the first fan if T1 is lower than the desired operating temperature range;
decreasing the speed of the second fan if T2 is lower than the desired operating temperature range; and
decreasing the speed of the third fan if T3 is lower than the desired operating temperature range.

20. The method of claim 19 wherein:
the steps of increasing and decreasing the speed of the fans is performed by any one of the following: microcontroller, CPU, and microprocessor.

* * * * *